(12) United States Patent
Bolotin et al.

(10) Patent No.: US 6,236,902 B1
(45) Date of Patent: May 22, 2001

(54) APPARATUS AND METHOD FOR RETAINING A DEVICE FOR PROCESSING

(75) Inventors: Lev M. Bolotin, Kirkland; Carl W. Olson, Renton, both of WA (US)

(73) Assignee: Data I/O Corporation, Redmond, WA (US)

(*) Notice: Subject to any disclaimer, the term of this patent is extended or adjusted under 35 U.S.C. 154(b) by 0 days.

(21) Appl. No.: 09/028,692

(22) Filed: Feb. 24, 1998

(51) Int. Cl.[7] ............................. G06F 19/00; B65H 49/07
(52) U.S. Cl. ......................... 700/121; 700/112; 700/213; 700/228; 414/222.12; 414/222.13; 414/222.01; 414/936
(58) Field of Search ................... 414/222.01, 222.02, 414/222.03, 222.04, 222.05, 222.06, 222.07, 222.08, 222.09, 222.1, 222.11, 222.12, 222.13, 226.01, 226.02, 226.03, 226.04, 226.05, 936, 416; 700/227, 112, 115, 121, 166, 213, 228

(56) References Cited

U.S. PATENT DOCUMENTS

| | | | |
|---|---|---|---|
| 4,915,565 | * | 4/1990 | Bond et al. ............................. 29/740 |
| 5,374,888 | * | 12/1994 | Karasawa ............................. 324/765 |
| 5,475,317 | * | 12/1995 | Smith ................................... 324/760 |
| 5,516,732 | * | 5/1996 | Flegal .................................. 438/800 |
| 5,870,820 | * | 2/1999 | Arakawa et al. ...................... 29/740 |
| 5,920,481 | * | 7/1999 | Ichihara et al. ....................... 700/121 |

* cited by examiner

Primary Examiner—William Grant
Assistant Examiner—Paul Rodriguez
(74) Attorney, Agent, or Firm—Dorsey & Whitney LLP

(57) ABSTRACT

In a device processing system, an apparatus and method for retaining a device that is to be transferred to or from the apparatus at a transfer location and processed at a processing location that is spaced from the transfer location is shown and described. A first device is placed on a first chuck at the transfer location with the chuck facing a first direction. The apparatus then rotates from a first position to a second position in which the device is at the processing location and facing in a second direction which is different from the first direction. While the apparatus is in the second position, a second device may be placed on a second chuck that is now oriented in the first direction at the transfer location. When the apparatus is rotated from the second position to the first position, the first device is returned to the transfer location and the second device is moved into the processing location.

39 Claims, 6 Drawing Sheets

APPARATUS AND METHOD FOR RETAINING A DEVICE FOR PROCESSING

TECHNICAL FIELD

The invention is directed toward an apparatus and method for retaining a device and, more particularly, to an apparatus and method for retaining a device while moving it between a first location at which the device is transferred to or from the apparatus, and a second, distinct location at which the device is processed.

BACKGROUND OF THE INVENTION

When manipulating integrated circuits and other electronic devices, an automated device handler is commonly used to pick up the device at one location and place it at another location for processing, marking, storage, etc. The handler comprises a positioning mechanism that is moved by an actuator. The positioning mechanism picks up the device with a chuck or a gripper that may rotate about the vertical axis of the handler. The rotation of the chuck combined with the movement of the positioning mechanism enables the handler to pick up and deliver a device to any location, in any orientation, within the working space of the handler.

Devices are often marked to indicate to the user how that particular device was processed. For example, a programmable read-only memory ("PROM") may be marked with indicia to identify a program or data stored in the PROM. After being processed, the device is picked up by the chuck on the handler's positioning mechanism and is delivered to the marker. The marker comprises a marker, such as a laser marking head, and a support mechanism where the device is held during marking. The device is placed onto the support mechanism, marked by the laser, then picked up by the positioning mechanism and delivered to a storage location for devices that have been processed.

FIGS. 1A–1E are schematic diagrams indicating the steps involved in marking devices according to the prior art. In FIG. 1A, a device 2a is being marked by a marker 4, such as a laser. The device 2a is supported by a chuck 6a which is rigidly mounted on a turntable 8. A number of chucks 6 are positioned about the perimeter of the turntable 8, with each chuck 6 oriented vertically to position the devices 2 for marking. The chucks 6 are each essentially conduits of a resilient material that are open ended. The conduits are coupled to a vacuum source so that the devices 2 are securely held on the chucks 6 by suction. Other types of chucks may alternatively be used. The marker 4 is positioned directly above the turntable 8, and is aimed downward at the device 2a. While one device 2a is being marked, a second device 2b is engaged with the chuck 6b adjacent the chuck 6a in the marking position. Thus, once the first device 2a is marked, the turntable 8 can rotate, moving the adjacent device 2b into the marking position.

During the marking process, a positioning mechanism 10 picks up yet another device 2c from a first storage location 12. The positioning mechanism 10 has a positioning chuck 11 at one end that is adapted to engage and then pick up devices 2 such as integrated circuits. The positioning mechanism 10 is also positioned in a vertical orientation. This orientation allows the positioning mechanism 10 to properly place the device 2c in the chuck 6c on the turntable 8, as well as to properly remove the device 2c therefrom.

As shown in FIG. 1B, the turntable 8 has rotated so that the device 2b is at the marking position, and the positioning mechanism 10 is placing an unmarked device 2c on the next available chuck 6c. After each device 2 is marked, the turntable rotates to position the next chuck 6 into the proper position for marking the next device 2.

After being marked, the device 2a is picked up by the positioning mechanism 10 and delivered to a second storage location 14, as shown in FIGS. 1C and 1D. After the positioning mechanism 10 places the device 2a in the second storage location 14, the positioning mechanism 10 returns to the first storage location 12 in order to pick up another unmarked device 2d, as shown in FIG. 1E. At this point, the above-described process starts over.

Because the positioning mechanism 10 and the marker 4 are both oriented above the device 2 being marked, simultaneous operation of the positioning mechanism 10 and the marker 4 requires that the chucks 6 on the turntable 8 be spaced apart far enough to prevent interference between the positioning mechanism 10 and the marker 4. To account for this, the size of the turntable 8 must be quite large, thereby making any device incorporating such a system large as well.

Another problem with the prior art system shown in FIGS. 1A–E is caused by the upwardly facing orientation of the chucks 6. More specifically, the chucks 6 face upwardly so that any dust generated during the marking process can be drawn into the chucks, thus creating additional costs associated with cleaning the system and possibly damaging it.

Yet another problem with the prior art system shown in FIGS. 1A–E is caused by the downwardly facing orientation of the processor. For example, where the processor is a laser marker oriented directly above the device, smoke rising from the face of the device 2 being marked can soil the laser's lens, adversely affecting the laser's performance and creating additional costs associated with cleaning the lens.

A need therefore exists for an improved method and apparatus for retaining devices during processing.

SUMMARY OF THE INVENTION

An apparatus and method according to one embodiment of the present invention alternatingly retains a device at two distinct locations: a transfer location at which the device is transferred to or from the apparatus, and a process location at which the device is processed. The apparatus comprises a mounting structure on which a first chuck is rigidly connected. The first chuck releasably engages one of the devices. The mounting structure is rotatably attached to a support mechanism on which the mounting structure may rotate between a first position and a second position.

When the mounting structure is in the first position, the first chuck is near the transfer location and is facing in a first direction. In this configuration, a positioning mechanism can transfer a device to the first chuck. The mounting structure may then rotate from the first position to the second position. When the mounting structure is in the second position, the first chuck is near the process location and is facing in a second direction. In this configuration, a processor, such as a marker, may process the device. Following processing, the mounting structure can rotate from the second position to the first position, where the positioning mechanism can remove the device from the first chuck.

In another embodiment of the present invention, the apparatus further comprises a second chuck connected to a surface of the mounting structure. The surface onto which the second chuck is connected may be continuous with the surface of the first chuck, such as two points about the perimeter of a cylinder; the two surfaces may be discontinuous, such as where the surfaces are two faces of a cube; or the two surfaces can be non-contiguous, such as where the two surfaces are on separate plates. The second chuck, like the first chuck, releasably engages one of the devices.

When the mounting structure is in the second position, the second chuck is near the transfer location and is facing in the first direction. This allows the system to either place an unprocessed device at, or remove a processed device from, the second chuck while a device on the first chuck is being processed. The system can thus sequentially place a second device onto the apparatus while a first device is being processed, remove the first device while the second device is being processed, and then place a third device onto the apparatus while the second device is being processed, and so on.

In yet another embodiment of the present invention, the apparatus comprises a plurality of first chucks and a plurality of second chucks. In this embodiment, numerous devices can be placed onto one surface of the mounting structure while numerous other devices are processed.

In still another embodiment of the present invention, the second direction in which the chuck faces is horizontal. By orienting the second direction horizontally, dirt and debris created during processing of the devices tends to drop past the chuck rather than into the chuck. Also, because the second direction is horizontal, the processor operates on the device from the side. Thus, any smoke emitted from the device during processing rises away from the processor, not into the processor.

Finally, by orienting the transfer location and the process location in different planes, the processor and the positioning mechanism are less likely to obstruct each other. Consequently, the entire system can be much smaller, thus occupying less space.

DETAILED DESCRIPTION OF THE INVENTION

Figure 1A:
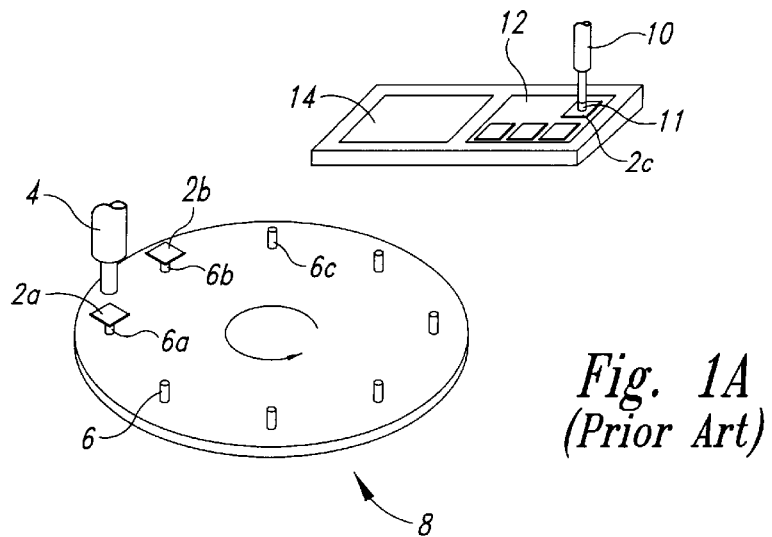
FIGS. 1A–1E are schematic representations of an apparatus and method for retaining a device for processing according to the prior art.
Figure 1B:
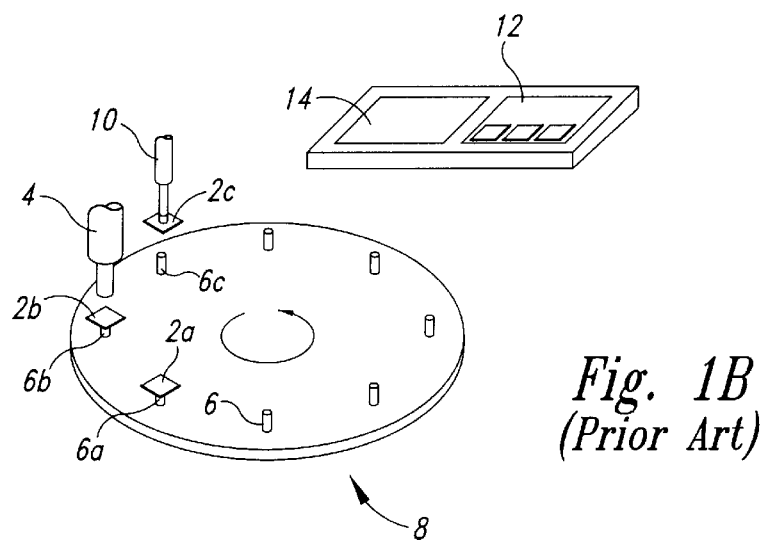
Figure 1C:
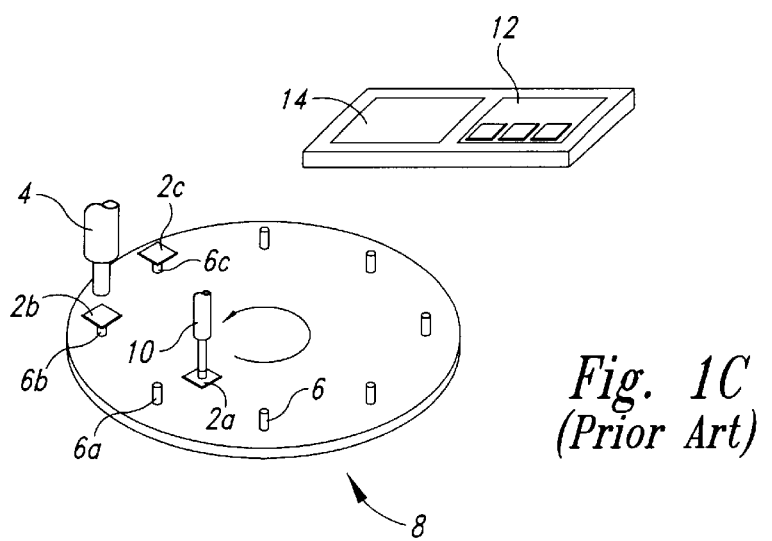
Figure 1D:
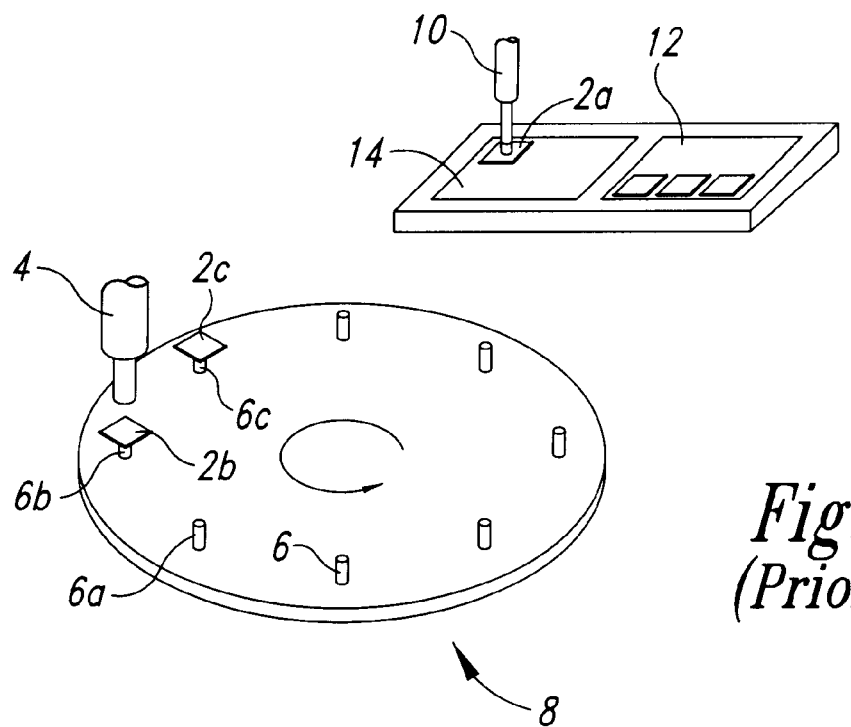
Figure 1E:
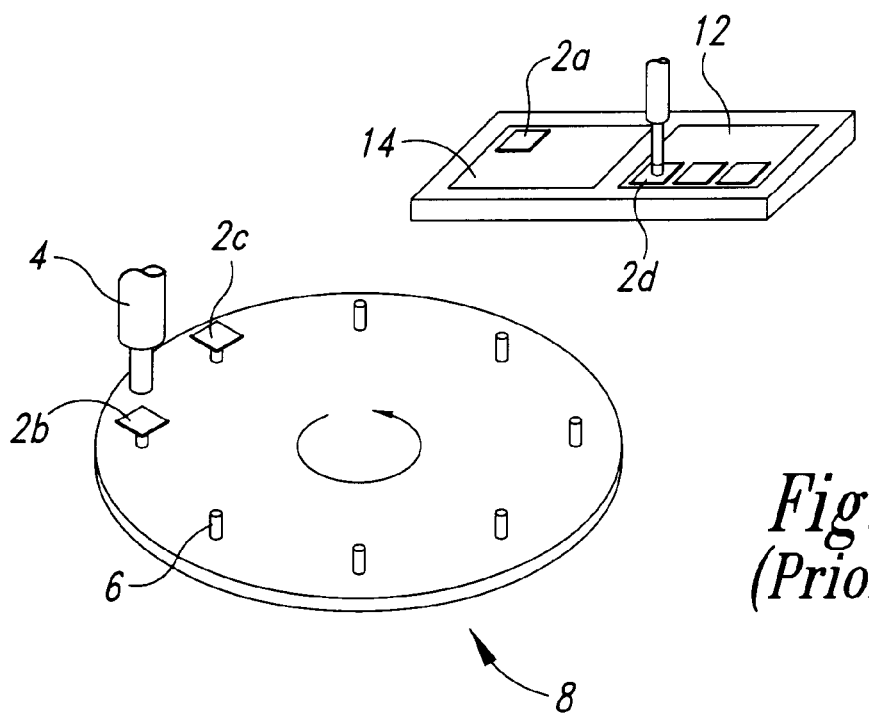
Figure 2A:
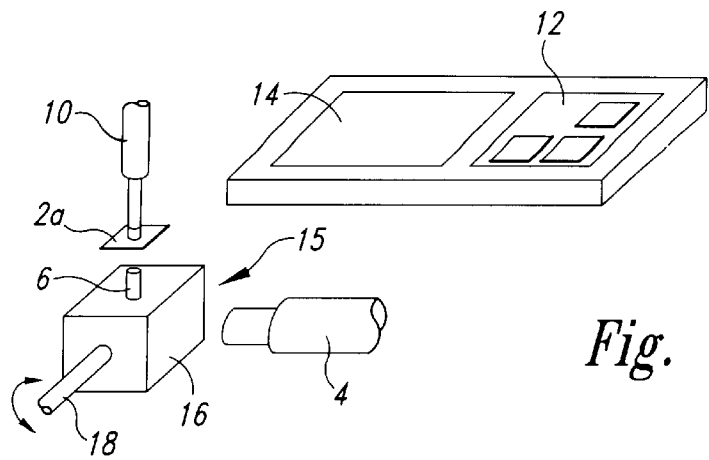
FIGS. 2A–2F are schematic representations of an apparatus and method for retaining a device for processing according to a first embodiment of the present invention.

FIGS. 2A–2F are schematic illustrations of a method and apparatus for retaining a device for processing according to a first embodiment of the present invention. In FIG. 2A, a retaining mechanism 15 includes a mounting structure 16 having a surface on which a chuck 6 is mounted. The mounting structure 16 is supported by a support shaft 18, which may be rotated to position the chuck 6 at various locations, as explained below.

As shown in FIG. 2A, the positioning mechanism 10 moves a device 2a from a first storage location 12 to the chuck 6. The device 2a can be an integrated circuit or other electronic device. The chuck 6 can be a vacuum chuck, as explained above, or any other support mechanism known in the art.

Figure 2B:
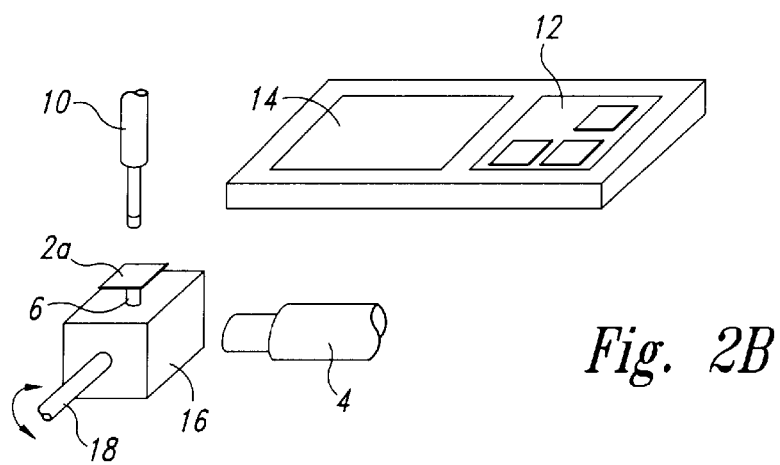

As shown in FIG. 2B, the positioning mechanism 10 has placed the device 2a on the chuck 6, and the chuck 6 retains the device 2a by suction. The support shaft 18 is then rotated 90 degrees from a first position (FIG. 2B) to a second position, as shown in FIG. 2C.

When the mounting structure 16 is in the first position, shown in FIG. 2B, the chuck 6 is near a transfer location where a device 2a is transferred to and from the chuck 6. In this orientation, the chuck 6 is facing in a first direction, i.e. upwardly. When the mounting structure 16 is in the second position, the chuck 6 is located at a processing location where the device 2a is processed. In this orientation, the chuck 6 is facing in a second direction, i.e. horizontally. In the exemplary embodiment, the processor is a marker 4.

Figure 2C:
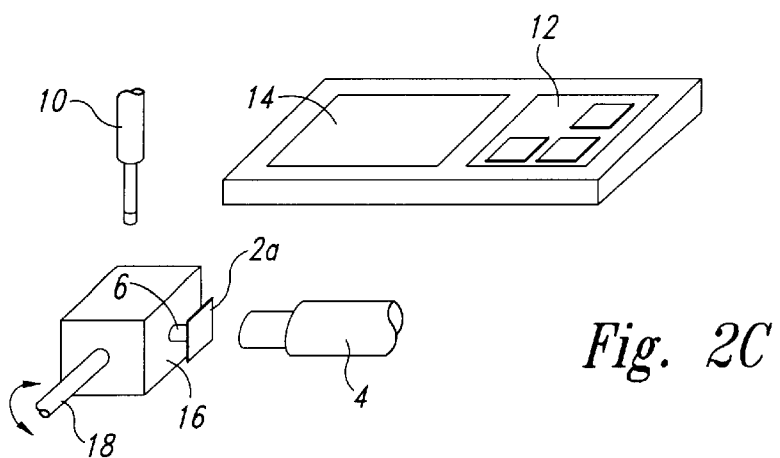
Figure 2D:
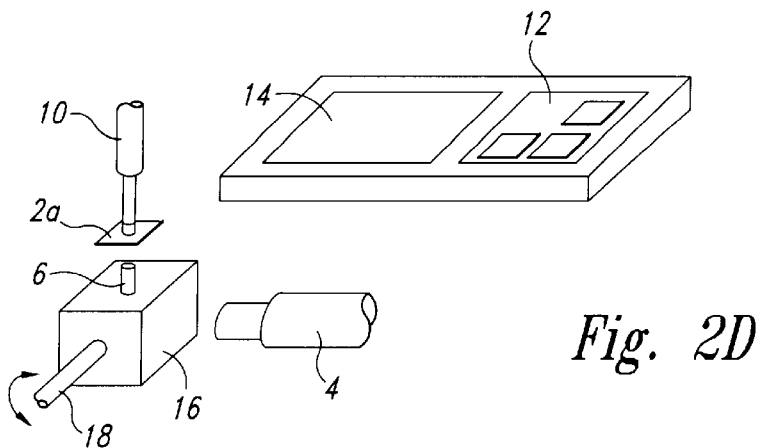
Figure 2E:
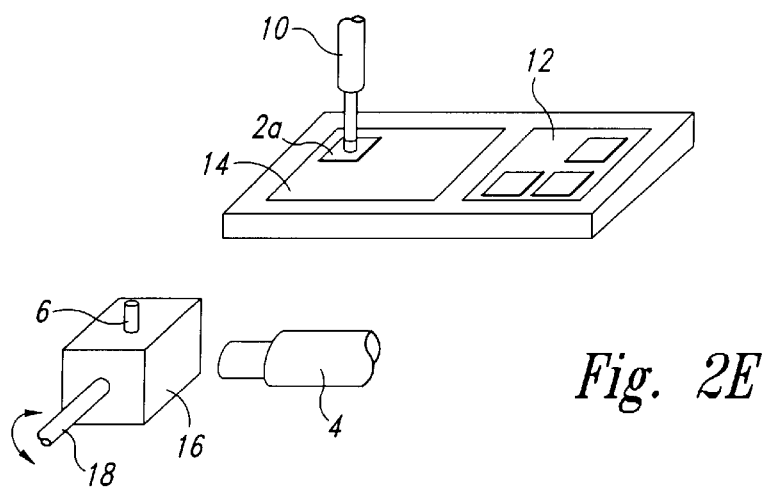
Figure 2F:
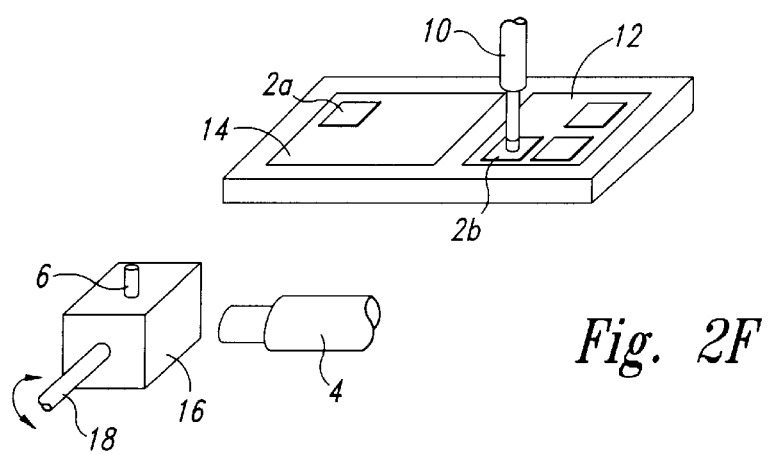

After the device 2a has been processed, as shown in FIG. 2C, the support shaft 18 rotates to move the mounting structure 16 from the second position to the first position. As is shown in FIG. 2D, the positioning mechanism 10 then picks up the device 2a from the chuck 6, and delivers the processed device 2a to the second storage location 14, as shown in FIG. 2E. Finally, as shown in FIG. 2F, the positioning mechanism 10 picks up another unprocessed device 2b from the first storage location 12 to be processed as described immediately above.

Figure 3:
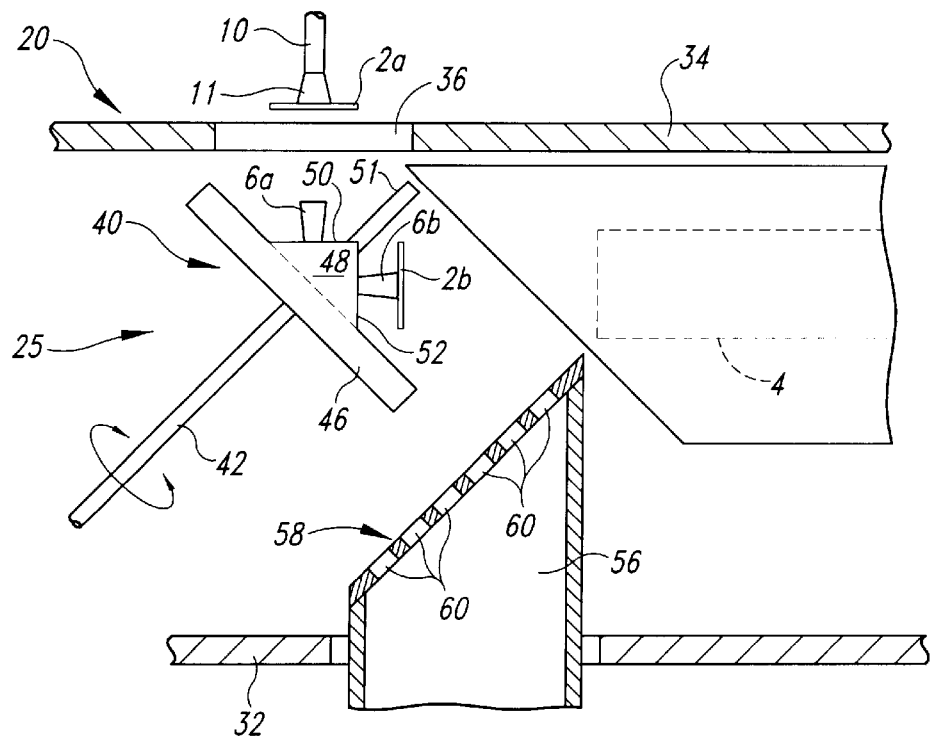
FIG. 3 is an elevation view of an apparatus for retaining a device for processing according to a second embodiment of the present invention.
Figure 4:
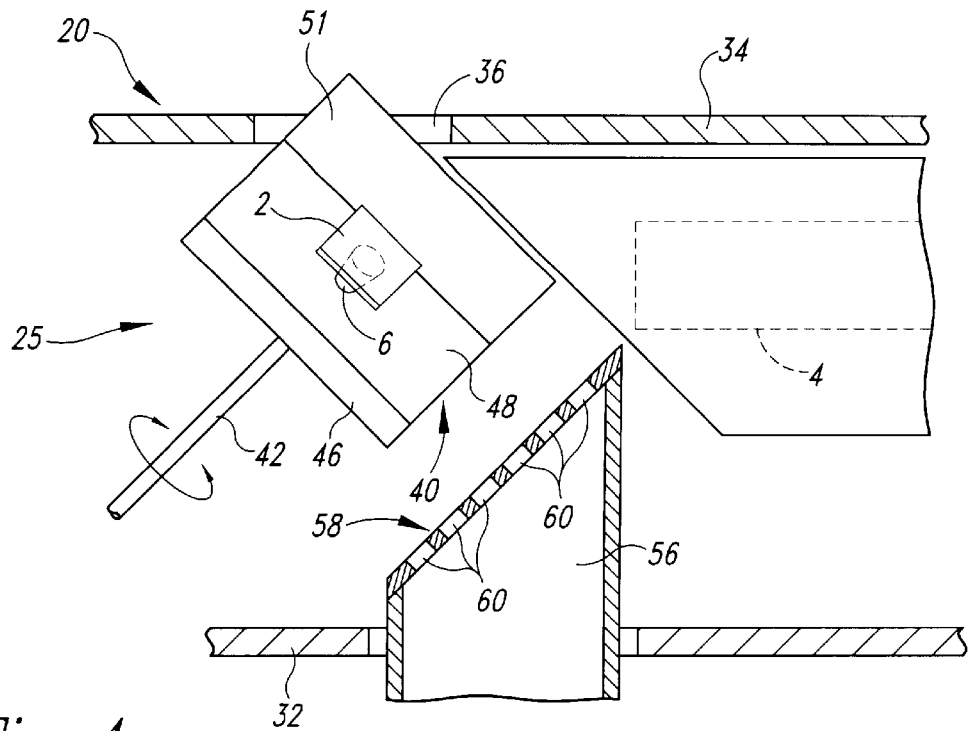
FIG. 4 is an elevation view of an apparatus for retaining a device for processing according to a second embodiment of the present invention.

FIGS. 3 and 4 show an apparatus 25 for retaining a device 2 for processing according to a second particular embodiment of the present invention. The apparatus 25 includes a housing 20 having a base 32 and a cover 34. An aperture 36 is formed in the cover 34 through which a device 2, such as an integrated circuit, may be inserted by the positioning mechanism 10.

The apparatus 25 also includes a support structure 40 that is mounted on a support shaft 42. The support structure 40 includes a support plate 46 on which a mounting block 48 is attached in a position that is symmetrical with respect to the support shaft 42. A first chuck 6a is mounted on a first surface 50 of the mounting block 48, and a second chuck 6b is mounted on a second surface 52 of the mounting block 48. A device 2b is releasably attached to the second chuck 6b.

Figures 3A, 3B:
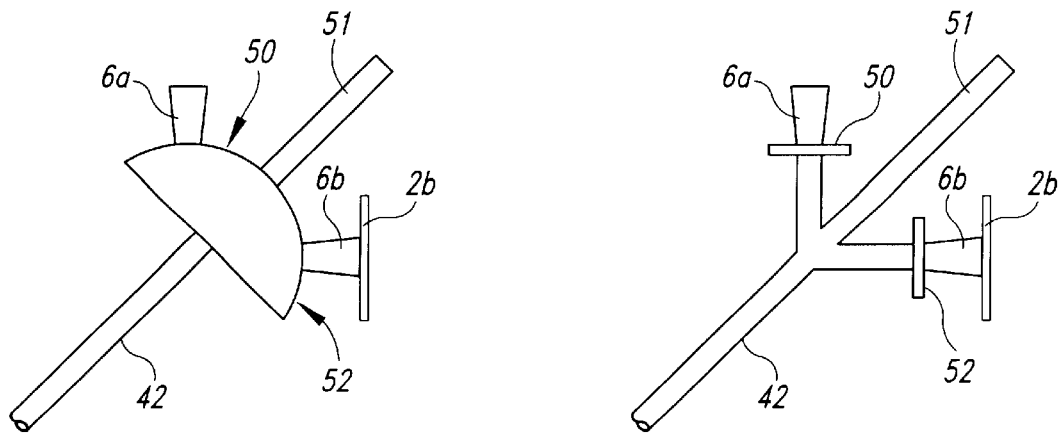
FIGS. 3A–3B are elevation views of a portion of a retaining device for processing according to alternative embodiments of the present invention.

The mounting block 48 has an orthogonal cross-section, so that first chuck 6a and the second chuck 6b are oriented perpendicular to each other, although it is understood that other configurations may be used. For example, the first surface 50 may be continuous with the second surface 52 of the first chuck, such as two points about the perimeter of a cylinder (FIG. 3A). The two surfaces may also be non-contiguous, such as where the first surface 50 and the second surface 52 are on separates plates (FIG. 3B). The first and second surfaces 50, 52, respectively, of the mounting block 48 intersect the support shaft 47 at an angle of approximately 45 degrees. The support shaft 42 also intersects the base 32 of the housing 20 at an angle of approximately 45 degrees. As a result, the angle between the first chuck 6a and the base 32 is 90 degrees, and the angle between the second chuck 6b and the base 32 is zero degrees. Furthermore, if the support shaft 42 is rotated 180 degrees about its longitudinal axis, the chucks 6a, 6b switch places so that the first chuck 6a is now horizontal, and the second chuck 6b is now vertical. A shield 51 extends between the chucks 6a, 6b to prevent laser light or debris caused by marking from escaping through the opening 36.

A dust collection plenum 56 is positioned below the device 2b when the device 2b is in the processing location. The uppermost end of the plenum 56 terminates in an opening that is covered with a mesh 58 having a plurality of orifices 60.

In operation, the positioning mechanism 10 places a first device 2a onto a first chuck 6a which is in the transfer location. The positioning arm 10 is oriented above the housing 20, and extends through the aperture 36 in the cover 34 until the first device 2a has contacted the first chuck 6a. The positioning mechanism 10 then releases the first device 2a, and the first chuck 6a engages the first device 2a.

While the first device 2a is being transferred to the first chuck 6a, the second device 2b, positioned on the second chuck 6b, is in the processing location. The marker 4 is processing the second device 2b. Dust or debris generated during processing falls from the second device 2b, through the orifices 60 of the mesh 58, and into the plenum 56 and is evacuated from the system. Smoke generated during processing rises through the aperture 36 in the cover 34. If laser light is deflected from the second device 2b toward the aperture 36, it collides with the shield 51 before it can escape from the housing 20.

Once the second device 2b has been completely processed, the support shaft 42 rotates 180 degrees, moving the now processed second device 2b into the transfer location and the unprocessed first device 2a into the processing location. While the marker 4 is processing the first device 2a, the positioning mechanism 10 removes the second device 2b and replaces it with another unprocessed device.

Figure 5:
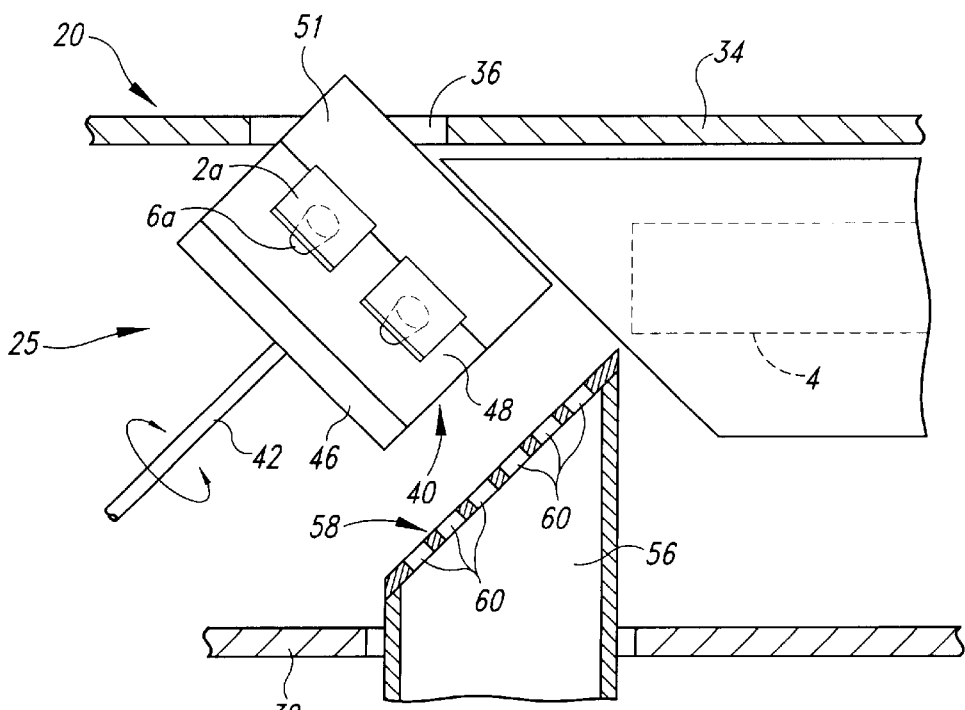
FIG. 5 is an elevation view of an apparatus for retaining a device for processing according to a third embodiment of the present invention.

FIG. 5 shows an apparatus 25 for retaining a device 2 for processing according to a third particular embodiment of the present invention. In this embodiment, each surface of the mounting block 48 carries a pair of chucks 6, which are mounted in the same manner as explained above with reference to FIGS. 3 and 4. In the exemplary embodiment, two first chucks 6a are shown, although more chucks may also be used. When the support plate 46 is in the first position, two devices 2a can be engaged by the two first chucks 6a, respectively. When the support plate 46 is rotated into the second position, two more devices 2b (hidden) can be engaged by the two second chucks 6b (hidden) while the first two devices 2a are being processed.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus for holding a device that is to be transferred to or from the apparatus at a transfer location and processed at a processing location that is spaced from the transfer location, the apparatus comprising:
    a mounting structure;
    a first chuck attached to the mounting structure and being adapted to releasably hold the device, the first chuck facing in a first direction extending along a first axis;
    a second chuck attached to the mounting structure and being adapted to releasably hold the device, the second chuck facing in a second direction extending along a second axis that lies in a common plane with the first axis;
    a support mechanism attached to the mounting structure to allow the mounting structure to rotate about a support axis lying in a common plane with the first axis and the second axis between first and second positions, the mounting structure positioning the first chuck near the transfer location and the second chuck near the processing location when the mounting structure is in the first position, and positioning the first chuck near the processing location and the second chuck near the transfer location when the mounting structure is in the second position.

2. The apparatus of claim 1 wherein the device comprises an integrated circuit.

3. The apparatus of claim 1 wherein the first chuck is attached to a first surface of the mounting structure and the second chuck is attached to a second surface of the mounting structure, and further wherein the first surface is non-contiguous with the second surface.

4. The apparatus of claim 1 further comprising a plurality of first chucks attached to a surface of the mounting structure and being adapted to releasably hold the device.

5. The apparatus of claim 4 further comprising a plurality of second chucks attached to a surface of the mounting structure and being adapted to releasably hold the device, the surface to which the second chucks are attached being non-coplanar with the surface to which the first chucks are attached.

6. The apparatus of claim 1 further comprising a shield positioned between the first chuck and the second chuck whereby particles and light are blocked from passing between the transfer location and the processing location.

7. An apparatus for holding a device that is to be transferred to or from the apparatus at a transfer location and processed at a processing location that is spaced from the transfer location, the apparatus comprising:
    a mounting structure;
    a first chuck attached to the mounting structure and being adapted to releasably hold the device, the first chuck facing in a first direction extending along a first axis;
    a second chuck attached to the mounting structure and being adapted to releasably hold the device, the second chuck facing in a second direction extending along a second axis that is different from the first axis, the first axis and the second axis defining a chuck separation angle that is less than 180 degrees; and
    a support mechanism attached to the mounting structure to allow the mounting structure to rotate between first and second positions about an axis that substantially bisects the chuck separation angle, the mounting structure positioning the first chuck near the transfer location and the second chuck near the processing location when the mounting structure is in the first position, and positioning the first chuck near the processing location and the second chuck near the transfer location when the mounting structure is in the second position.

8. The apparatus of claim 7 wherein the device comprises an integrated circuit.

9. The apparatus of claim 7 wherein the first direction is perpendicular to the second direction.

10. The apparatus of claim 7 further comprising a plurality of first chucks attached to the mounting structure and being adapted to releasably hold the device, the first chucks facing in a first direction.

11. The apparatus of claim 10 further comprising a plurality of second chucks attached to the mounting structure and being adapted to releasably hold the device, the second chucks facing in a second direction, the second direction being different from the first direction.

12. The apparatus of claim 7 further comprising a shield positioned between the first chuck and the second chuck whereby particles and light are blocked from passing between the transfer location and the processing location.

13. The apparatus of claim 7 wherein the first chuck is attached to a first surface of the mounting structure and the second chuck is attached to a second surface of the mounting structure, the first surface being non-contiguous with the second surface.

14. A system for positioning a plurality of devices to be processed comprising:
a means for processing the devices;
a positioning mechanism;
a positioning chuck connected to the positioning mechanism, the positioning chuck adapted to releasably engage the devices;
a mounting structure;
a first chuck attached to the mounting structure and being adapted to releasably hold the device, the first chuck facing in a first direction extending along a first axis;
a second chuck attached to the mounting structure and being adapted to releasably hold the device, the second chuck facing in a second direction extending along a second axis, the second axis being co-planer with the first axis; and
a support mechanism attached to the mounting structure to allow the mounting structure to rotate between first and second positions about an axis that is co-planar with the first axis and the second axis, the mounting structure positioning the first chuck near a transfer location and the second chuck near a processing location when the mounting structure is in the first position, and positioning the first chuck near the processing location and the second chuck near the transfer location when the mounting structure is in the second position.

15. The system of claim 14 wherein the devices comprise integrated circuits.

16. The system of claim 14 wherein the first chuck is attached to a first surface of the mounting structure and the second chuck is attached to a second surface of the mounting structure, and further wherein the first surface is non-contiguous with the second surface.

17. The system of claim 14 wherein the processing means is a marker.

18. The system of claim 14 further comprising a plurality of first chucks attached to a surface of the mounting structure and being adapted to releasably hold the device.

19. The system of claim 18 further comprising a plurality of second chucks attached to a surface of the mounting structure and being adapted to releasably hold the device, the surface to which the second chucks are attached being non-coplanar with the surface to which the first chucks are attached.

20. The system of claim 14 further comprising a shield positioned between the first chuck and the second chuck whereby particles and light are blocked from passing between the transfer location and the processing location.

21. A system for positioning a plurality of devices to be processed comprising:
a means for processing the devices;
a positioning mechanism;
a positioning chuck connected to the positioning mechanism, the positioning chuck adapted to releasably engage the devices;
a mounting structure;
a first chuck attached to the mounting structure and being adapted to releasably hold the devices, the first chuck facing in a first direction extending along a first axis;
a second chuck attached to the mounting structure and being adapted to releasably hold the devices, the second chuck facing in a second direction extending along a second axis that is different from the first axis, the first axis and the second axis defining a chuck separation angle that is less than 180 degrees; and
a support mechanism attached to the mounting structure to allow the mounting structure to rotate between first and second positions about an axis that substantially bisects the chuck separation angle, the mounting structure positioning the first chuck near a transfer location and the second chuck near a processing location when the mounting structure is in the first position, and positioning the first chuck near the processing location and the second chuck near the transfer location when the mounting structure is in the second position.

22. The system of claim 21 wherein the devices comprise integrated circuits.

23. The system of claim 21 wherein the first direction is perpendicular to the second direction.

24. The system of claim 21 wherein the processing means is a marker.

25. The system of claim 21 further comprising a plurality of first chucks attached to the mounting structure and being adapted to releasably hold the devices, the first chucks facing in a first direction.

26. The system of claim 25 further comprising a plurality of second chucks attached to the mounting structure and being adapted to releasably hold the devices, the second chucks facing in a second direction, the second direction being different from the first direction.

27. The system of claim 21 further comprising a shield positioned between the first chuck and the second chuck whereby particles and light are blocked from passing between the transfer location and the processing location.

28. The system of claim 21 wherein the first chuck is attached to a first surface of the mounting structure and the second chuck is attached to a second surface of the mounting structure, the first surface being non-contiguous with the second surface.

29. A method for positioning devices to be processed comprising:
engaging a first device with a first chuck that is oriented at an angle of less than 90 degrees from an axis of rotation, such that the first chuck faces in a first direction when the first chuck is in a first position;
rotating the first chuck about the axis of rotation from the first position to a second position such that the first chuck faces in a second direction that is different from the first direction; and
processing the first device.

30. The method of claim 29 further comprising:
engaging a second device with a second chuck, the second chuck being at a chuck separation angle of less than 180 degrees with the first chuck wherein the first chuck and the second chuck rotate about the axis of rotation which bisects the chuck separation angle, such that the second chuck faces in the first direction when the first chuck is in the second position;
rotating the first chuck and the second chuck about the axis of rotation from the second position to the first position such that the second chuck faces in the second direction; and
processing the second device.

31. The method of claim 30 wherein the first device and the second device comprise integrated circuits.

32. The method of claim 30 wherein the first direction is perpendicular to the second direction.

33. A method according to claim 30 wherein the step of processing the first and second devices comprises marking the devices.

34. A method for positioning a plurality of devices to be sequentially processed, the method comprising:

storing a plurality of devices in a first storage location;

removing a first device from the first storage location;

engaging the first device with a first chuck that is oriented at an angle of less than 90 degrees from an axis of rotation such that the first chuck faces in a first direction when the first chuck is in a first position;

rotating the first chuck about the axis of rotation from the first position to a second position such that the first chuck faces in a second direction that is different from the first direction;

processing the first device;

removing a second device from the first storage location;

engaging the second device with a second chuck, the second chuck making a chuck separation angle of less 180 degrees with the first chuck, wherein the first chuck and the second chuck rotate about the axis of rotation which bisects the chuck separation angle, such that the second chuck faces in the first direction when the rotating shaft is in the second position;

rotating the first chuck and the second chuck about the axis of rotation from the second position to the first position such that the second device is in the second position and the first device is in the first position;

processing the second device;

removing the first device from the first chuck; and placing the first device in a second storage location.

35. The method of claim 34 wherein the devices comprise integrated circuits.

36. The method of claim 34 wherein the first storage location is an input tray.

37. The method of claim 34 wherein the first direction is perpendicular to the second direction.

38. The method of claim 34 wherein the step of processing devices comprises marking the devices.

39. The method of claim 34 wherein the second storage location is an output tray.

* * * * *